United States Patent
Kim et al.

(10) Patent No.: US 9,054,489 B2
(45) Date of Patent: Jun. 9, 2015

(54) HYBRID VERTICAL CAVITY LASER FOR PHOTONIC INTEGRATED CIRCUIT

(71) Applicant: Samsung Electronics Co., Ltd., Suwon-Si, Gyeonggi-Do (KR)

(72) Inventors: Taek Kim, Seongnam-si (KR); Igor Shcherbatko, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 13/974,596

(22) Filed: Aug. 23, 2013

(65) Prior Publication Data

US 2014/0098833 A1 Apr. 10, 2014

(30) Foreign Application Priority Data

Oct. 10, 2012 (KR) .................. 10-2012-0112655

(51) Int. Cl.
*H01S 3/08* (2006.01)
*H01S 5/10* (2006.01)
(Continued)

(52) U.S. Cl.
CPC . *H01S 5/105* (2013.01); *H01S 5/10* (2013.01); *H01S 5/12* (2013.01); *H01S 5/1206* (2013.01); *H01S 5/2018* (2013.01); *H01S 5/021* (2013.01); *H01S 5/0215* (2013.01); *H01S 5/026* (2013.01); *H01S 5/18308* (2013.01);
(Continued)

(58) Field of Classification Search
CPC ........... H01S 5/10; H01S 5/12; H01S 5/1206; H01S 5/2018
USPC ........................................... 372/92, 102, 108
See application file for complete search history.

(56) References Cited

U.S. PATENT DOCUMENTS

| 6,628,694 B2 | 9/2003 | Deng et al. |
| 7,627,018 B1 | 12/2009 | Guilfoyle et al. |

(Continued)

FOREIGN PATENT DOCUMENTS

| KR | 2007-0110808 A | 11/2007 |
| KR | 2008-0097162 A | 11/2008 |

(Continued)

OTHER PUBLICATIONS

L. Ferrier et al.: "Vertical microcavities based on photonic crystal mirrors for III-V/Si integrated microlasers"; Proceedings of SPIE—International Society for Optical Engineering, vol. 6989, pp. 69890W-1-69890W-12; Apr. 8, 2008; XP002573996.

(Continued)

*Primary Examiner* — Armando Rodriguez
(74) *Attorney, Agent, or Firm* — Harness, Dickey & Pierce, PLC

(57) ABSTRACT

According to example embodiments, a hybrid vertical cavity laser for a photonic integrated circuit (PIC) includes: a grating mirror between first and second low refractive index layers, an optical waveguide optically coupled to one side of the grating mirror, a III-V semiconductor layer including an active layer on an upper one of the first and second low refractive index layers, and a top mirror on the III-V semiconductor layer. The grating mirror includes a plurality of bar-shaped low refractive index material portions arranged parallel to each other. The low refractive index material portions include a plurality of first portions having a first width and a plurality of second portions having second width in a width direction. The first and second widths are different.

24 Claims, 10 Drawing Sheets

(51) Int. Cl.
*H01S 5/12* (2006.01)
*H01S 5/02* (2006.01)
*H01S 5/183* (2006.01)
H01S 5/20 (2006.01)
H01S 5/026 (2006.01)

(52) U.S. Cl.
CPC ........ *H01S 5/18341* (2013.01); *H01S 5/18361* (2013.01); *H01S 5/18363* (2013.01); *H01S 5/1838* (2013.01); H01S 5/1218 (2013.01); H01S 5/2063 (2013.01)

(56) References Cited

U.S. PATENT DOCUMENTS

| | | | |
|---|---|---|---|
| 8,249,123 | B2 | 8/2012 | Ikuta |
| 2007/0035838 | A1 | 2/2007 | Hunter et al. |
| 2007/0121694 | A1 | 5/2007 | Okamoto |
| 2009/0154517 | A1 | 6/2009 | Leem et al. |
| 2010/0243986 | A1 | 9/2010 | Ma et al. |
| 2011/0163336 | A1 | 7/2011 | Peng et al. |
| 2011/0188801 | A1 | 8/2011 | Zhou |
| 2011/0280269 | A1 | 11/2011 | Chang-Hasnain et al. |
| 2011/0280533 | A1 | 11/2011 | Chang-Hasnain et al. |
| 2012/0008658 | A1* | 1/2012 | Chung ................ 372/45.01 |
| 2012/0120977 | A1 | 5/2012 | Fattal et al. |

FOREIGN PATENT DOCUMENTS

| | | |
|---|---|---|
| KR | 2008-0100118 A | 11/2008 |
| KR | 2009-0015920 A | 2/2009 |
| WO | WO-2010-091688 A1 | 8/2010 |
| WO | WO-2010/138524 A2 | 12/2010 |
| WO | WO-2012/149497 A2 | 11/2012 |
| WO | WO-2012/149497 A3 | 11/2012 |

OTHER PUBLICATIONS

I. Chung et al: "Low-energy-consumption hybrid lasers for silicon photonics", 14th International Conference on Transparent Optical Networks (ICTON), pp. 1-3; Jul. 2, 2012; XP032214491.

European Search Report dated Jan. 30, 2014 for corresponding European application No. 13 187 255.8.

Huang, Michael C., et al., "A surface-emitting laser incorporating a high-index-contrast subwavelength grating", Nature Publishing Group, pp. 119-1, 2007.

Chung, Il-Sug, et al., "Silicon-Photonics Light Source Realized by III-V/Si-Grating-Mirror Laser," *Applied Physics Letters*, vol. 97, No. 151113-1, 2010.

* cited by examiner

HYBRID VERTICAL CAVITY LASER FOR PHOTONIC INTEGRATED CIRCUIT

CROSS-REFERENCE TO RELATED APPLICATIONS

This application claims the benefit of Korean Patent Application No. 10-2012-0112655, filed on Oct. 10, 2012 in the Korean Intellectual Property Office, the disclosure of which is incorporated herein in its entirety by reference.

BACKGROUND

1. Field

The present disclosure relates to hybrid vertical cavity lasers and/or hybrid vertical cavity lasers for a photonic integrated circuit (PIC).

2. Description of the Related Art

Electrical connections using metal wires for data transmission may have high power consumption due to increasing propagation loss at higher frequencies. These connections may also experience considerable electromagnetic interference (EMI). Both of these effects may cause difficulty in realizing the layout of a data transceiving system.

On the other hand, optical interconnections for transmitting and receiving data using light provide comparatively lower propagation loss and EMI. As a result, optical interconnections may be more suitable for realizing high-speed, high-bandwidth data transceiving systems.

A hybrid vertical cavity laser may have a structure in which a vertical cavity laser formed of a Group III-V semiconductor material is integrated on a silicon structure. A silicon-based photonic integrated circuit (PIC) may include a light source, an optical waveguide, an optical modulator, an optical filter, and a photodetector, as well as other optical components, and may deliver a signal through an optical interconnection.

A vertical cavity laser used for an optical interconnection may transmit a vertically resonant laser beam into a horizontally oriented optical waveguide. In such a device, it may be desirable to increase the optical coupling efficiency and/or to transmit a laser beam to an optical waveguide.

SUMMARY

Example embodiments relate to a hybrid vertical cavity laser which may be used for a photonic integrated circuit (PIC) that uses a grating mirror having improved coupling efficiency between a laser beam emitted from a resonator and an optical waveguide.

According to example embodiments, a hybrid vertical cavity laser for a PIC includes: a first low refractive index layer; a second low refractive index layer on the first low refractive index layer; a grating mirror between first and second low refractive index layers; an optical waveguide optically coupled to one side of the grating mirror; a Group III-V semiconductor layer on the second low refractive index layer, the Group III-V semiconductor layer including an active layer; and a top mirror on the Group III-V semiconductor layer. The grating mirror includes a material layer. The first and second low refractive index layers each have refractive indices that are lower than a refractive index of the material layer. The grating mirror includes a plurality of low refractive index material portions in the material layer that are arranged parallel to each and each have a bar shape. The plurality of low refractive index material portions extend in a first direction. The plurality of low refractive index material portions each have a lower refractive index than the refractive index of the material layer. The plurality of low refractive index material portions include a plurality of first portions having a first width in a second direction and a plurality of second portions having a second width in the second direction. The first width is different than the second width. The second direction is perpendicular to the first direction. The optical wave guide is coupled to the one side of the grating mirror in the second direction.

In example embodiments, the material layer may be a silicon layer.

In example embodiments, a material of the plurality of low refractive index material portions may be air.

In example embodiments, the second width may be 10 nm to 50 nm greater than the first width.

In example embodiments, the plurality of first portions may be alternately arranged with the plurality of second portions.

In example embodiments, each one of the plurality of second portions may be alternately arranged with at least two of the plurality of first portions. In example embodiments, N may be greater than or equal to 3, less than N of the plurality of second portions may be alternately arranged with every N of the plurality of first portions.

In example embodiments, the first width may be about 100 nm to about 200 nm.

In example embodiments, the material layer of the grating mirror and the optical waveguide may be defined by a top silicon layer of a silicon-on-oxide (SOI) substrate. In example embodiments, the material layer may be a silicon layer, and the silicon layer may include portions having a constant width between the plurality of low refractive index material portions.

In example embodiments, the laser may further include a third low refractive index layer between the grating mirror and the second low refractive index layer. A pattern of the third low refractive index layer may correspond to a pattern of the material layer of the grating mirror, and the plurality of low refractive index material portions may be surrounded by the material layer, the first low refractive index layer, the second low refractive index layer, and the third low refractive index layer.

According to example embodiments, a hybrid vertical cavity laser for a PIC includes: a first low refractive index layer; a second low refractive index layer on the first low refractive index layer; a grating mirror between first and second low refractive index layers; an optical waveguide optically coupled to one side of the grating mirror in a first direction; a Group III-V semiconductor layer on the second low refractive index layer and including an active layer; and a top mirror on the Group III-V semiconductor layer. The grating mirror includes a plurality of bars that are spaced apart from each other and arranged in an array. The first and second low refractive index layers each have refractive indices that are lower than a refractive index of the plurality of bars.

In example embodiments, each of the plurality of bars may be elongated in a second direction that crosses the first direction, and the plurality of bars may be a plurality of silicon bars.

In example embodiments, the plurality of bars and the optical waveguide may be defined by a top silicon layer of a silicon-on-oxide (SOI) substrate.

In example embodiments, a third low refractive index layer may be between the plurality of bars of the grating mirror and the second low refractive index layer, and a pattern of the third insulator layer may correspond to a pattern of the plurality of bars.

According to example embodiments, a hybrid vertical cavity laser for a PIC includes: a first low refractive index layer; and a second low refractive index layer on the first low refractive index layer; a grating mirror between the first and second low refractive index layers. The grating mirror includes a material layer. The first and second low refractive index layers have refractive indices that are lower than a refractive index of the material layer. The grating mirror includes a plurality of lower refractive index portions that are separated by parts of the material layer. The plurality of low refractive index material portions are arranged parallel to each other and each have a bar shape. Each one of the plurality of low refractive index material portions, in combination with an adjacent one of the parts of the material layer, have a same pitch in a first direction. The plurality of low refractive index material portions extend in a second direction that is perpendicular to the first direction. The plurality of low refractive index material portions have a refractive index that is lower than the refractive index of the material layer. The plurality of low refractive index material portions include a plurality of first portions having a first width in the first direction and a plurality of second portions having a second width that is different than the first width and extends in the first direction. An optical waveguide is optically coupled to one side of the grating mirror in the first direction. A Group III-V semiconductor layer including an active layer is on the second low refractive index layer. A top mirror is on the Group III-V semiconductor layer.

In example embodiments, the material layer may be a silicon layer.

In example embodiments, a material of each of the plurality of low refractive index material portions may be air.

In example embodiments, the second width may be 10 nm to 50 nm greater than the first width.

In example embodiments, the plurality of first portions may be alternately arranged with the plurality of second portions.

In example embodiments, each one of the plurality of second portions may be alternately arranged with at least two of the plurality of first portions.

In example embodiments, N may be greater than or equal to 3, less than N of the plurality of second portions may be alternately arranged with every N of the plurality of first portions.

In example embodiments, the first width may be about 100 nm to about 200 nm.

In example embodiments, the material layer and the optical waveguide may be defined by a top silicon layer of a silicon-on-oxide (SOI) substrate.

In example embodiments, a third low refractive index layer may be between the grating mirror and the second low refractive index layer, a shape of the third low refractive index layer may correspond to a shape of the material layer of the grating mirror, the plurality of low refractive index material portions may have a bar shape, and the plurality of low refractive index material portions may be surrounded by the material layer, the third low refractive index layer, and the first and second low refractive index layers.

According to example embodiments, a hybrid vertical cavity laser apparatus for a photonic integrated circuit (PIC) includes: a first low refractive index layer; a second low refractive index layer on the first low refractive index layer; a resonator layer on the second low refractive index layer, the resonator layer being configured to generate light in response to current injection; a top mirror on the resonator layer, a grating mirror between the first and second low refractive index layers; and a waveguide. The grating mirror includes a material layer that defines a plurality of bars that are spaced apart from each other in a first direction and extend in a second direction that crosses the first direction. The grating mirror includes a plurality of lower refractive index portions between the plurality of bars. The plurality of low refractive index material portions and the first and second low refractive index layers each have refractive indices that are lower than a refractive index of the plurality of bars. The plurality of low refractive index material portions include a plurality of first portions having a first width in the first direction and a plurality of second portions having a second width that is different than the first width and extends in the first direction. The waveguide extends in the first direction from a side of the grating mirror. The waveguide is configured to propagate in the first direction a portion of the light generated from the resonator layer that is diffracted by the grating mirror.

In example embodiments, the material layer, may be a silicon layer.

According to example embodiments, a hybrid vertical cavity laser apparatus for a photonic integrated circuit (PIC) includes: a first low refractive index layer; a second low refractive index layer on the first low refractive index layer; a resonator layer on the second low refractive index layer; a top mirror on the resonator layer; and a material layer between the first and second low refractive index layers. The material layer has a refractive index that is greater than refractive indices of the first and second low refractive index layers. The material layer defines a grating mirror that includes a plurality of first openings having first widths and a plurality of second openings having second widths that are separated by a plurality of bar-shaped portions of the material layer, and a remaining part of the material layer surrounding the plurality of first and second openings. The plurality of first and second openings are parallel to each other and expose the first low refractive index layer. The first widths are different than the second widths in a first direction. The material layer defines an optical waveguide that extends in the first direction from one side of the grating mirror.

In example embodiments, the plurality of first and second openings may be filled with a material having a refractive index that is less than the refractive index of the material layer.

In example embodiments, the material layer may be a silicon layer, the plurality of first and second openings may be filled with one of air and silicon dioxide, the first width may be about 100 nm to about 200 nm, and the second width may be 10 nm to 50 nm greater than the first width.

In example embodiments, the optical waveguide may extend in the first direction away from a side of the second low refractive index layer.

In example embodiments, the plurality of first and second openings have equal lengths in a second direction that crosses the first direction, and each one of the plurality of first openings is between an adjacent two of the plurality of second openings.

In example embodiments, the laser may further include: a p-type electrode on the top mirror; and an n-type electrode. The resonator may include an n-type semiconductor layer, an active layer, and a p-type semiconductor layer sequentially stacked on the second low refractive index layer. The p-type semiconductor layer may define an aperture through which the light generated by the resonator may pass, and the n-type electrode may be on a portion of the n-type semiconductor layer.

In example embodiments, the top mirror may be configured to reflect the light generated from the resonator layer towards the grating mirror so the light resonates between the top mirror and the grating mirror, and the optical waveguide may be configured to propagate in the first direction a portion of the resonating light that is diffracted from the grating mirror.

In example embodiments, the plurality of first openings and the plurality of second openings may be alternately arranged in the first direction.

In example embodiments, the plurality of bar-shaped portions of the material layer may have equal widths in the first direction.

In example embodiments, the plurality of bar-shaped portions of the material layer may have equal widths in the first direction.

In example embodiments, some of the plurality of bar-shaped portions may have different widths in the first direction than others of the plurality of bar-shaped portions.

BRIEF DESCRIPTION OF THE DRAWINGS

The above and other features and advantages of example embodiments will become more apparent by describing in detail example embodiments with reference to the attached drawings. The accompanying drawings should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
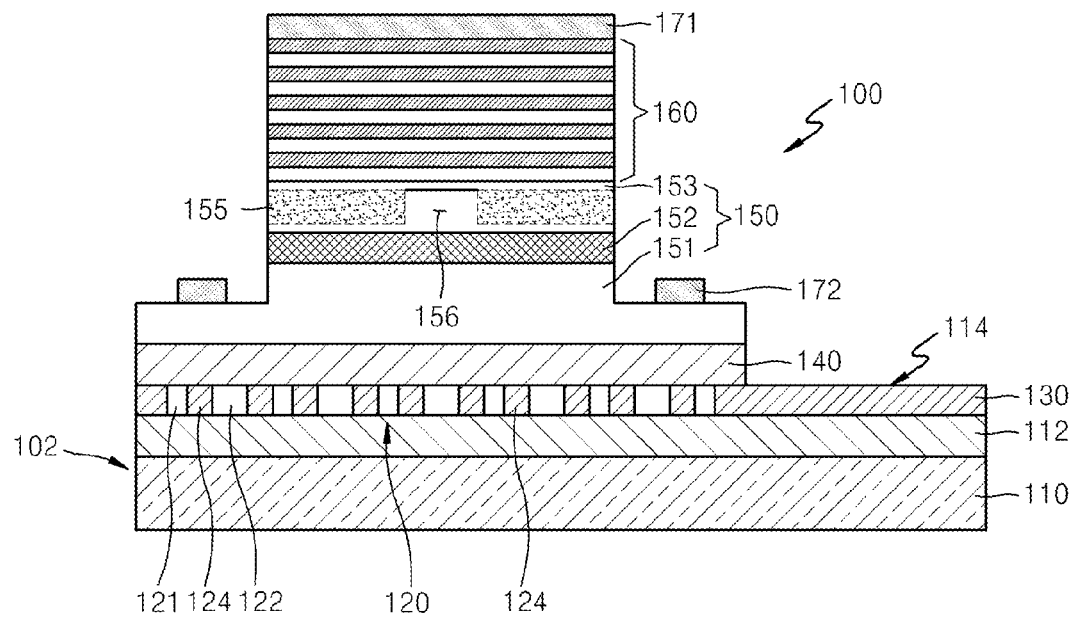
FIG. 1 is a schematic cross-sectional view of a hybrid vertical cavity laser for a photonic integrated circuit (PIC) according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
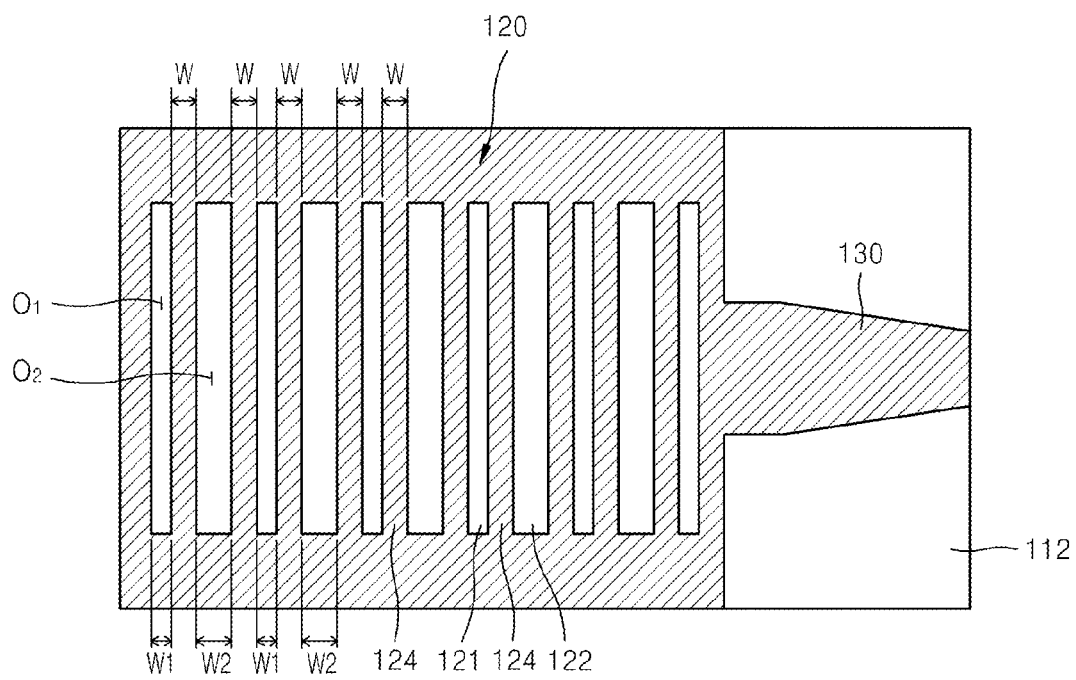
FIG. 2 is a schematic plan view of a grating mirror and an optical waveguide that may be included in the hybrid vertical cavity laser of FIG. 1.

FIG. 1 is a schematic cross-sectional view of a hybrid vertical cavity laser 100 which may be used for a photonic integrated circuit (PIC) according to example embodiments, and FIG. 2 is a schematic plan view of a grating mirror and an optical waveguide that may be included in the hybrid vertical cavity laser 100 for the PIC.

Referring to FIGS. 1 and 2, the hybrid vertical cavity laser 100 for the PIC includes a III-V semiconductor layer 150 that is a resonator layer, a top mirror 160 and a grating mirror 120 disposed above and below a Group III-V semiconductor layer 150, respectively, and an optical waveguide 130 disposed at one side of the grating mirror 120.

The optical waveguide 130 may be formed, for example, by etching a material layer 114 optically coupled to one side of the grating mirror 120. The grating mirror 120 may also be formed by etching the material layer 114. Hereinafter, an example is described where the material layer 114 is a silicon layer 114. However, example embodiments are not limited thereto and the material layer 114 may be made from different materials. For example, the material layer 114 may be made of a dielectric material having a relatively high refractive index, such as silicon nitride ($Si_3N_4$). The grating mirror 120 and the top mirror 160 (described in greater detail below) together may act as reflective layers that allow a laser beam to vertically resonate between the grating mirror 120 and the top mirror 160.

A low refractive index ("low-n") layer 112 is disposed below the grating mirror 120 and optical waveguide 130. The low-n layer 112 may have a refractive index that is lower than that the material layer 114. In example embodiments, when the material layer 114 is made of silicon, the low-n layer 112 may have a refractive index lower than silicon. However, example embodiments are not limited thereto and when the material layer 114 is made from a different material, the low-n layer 112 may have a refractive index that is lower than the material of the material layer 114.

In accordance with example embodiments, the refractive index layer 112 may be a silicon oxide ($SiO_2$) layer. Alternatively, the low refractive index layer 112 may be formed of zirconium oxide ($ZrO_2$), titanium oxide ($TiO_2$), magnesium oxide (MgO), cesium oxide ($CeO_2$), aluminum oxide ($Al_2O_3$), hafnium oxide ($HfO_2$), niobium oxide (NbO), or silicon nitride ($Si_3N_4$). The low refractive index layer 112 may hereinafter be referred to as a first insulating layer 112. As discussed above, the material layer 114 may be silicon nitride ($Si_3N_4$) so the first insulating layer 112 cannot be silicon nitride ($Si_3N_4$) when the material layer 114 is silicon nitride ($Si_3N_4$) because the first insulating layer 112 has a lower refractive index than the material layer 114.

A substrate 110 is disposed below the first insulating layer 112, and may be formed of a semiconductor such as silicon or another material.

According to example embodiments, a silicon-on-insulator (SOI) substrate 102 including the silicon substrate 110 and the first insulating layer 112 of silicon oxide and the silicon layer 114 overlying the first insulating layer 112 may be used. The first insulating layer 112 may have a thickness of greater than about 1000 nm; however, this thickness may vary depending on the intended application of the laser or PIC. Other optical components may be integrated together with the hybrid vertical cavity laser 100 onto the SOI substrate 102 to form the PIC.

A low refractive index ("low-n") layer 140 may be disposed on the grating mirror 120 and has a refractive index that is lower than the refractive index of the material layer 114 and the grating mirror 120, (e.g., the low refractive index layer 140 may have a refractive index that is lower than silicon when the material layer 114 is a silicon layer 114). The low-n layer 140 may be formed to cover the entire grating mirror 120 and a portion of the optical waveguide 130. The low-n layer 140 with a low refractive index may increase the reflectivity of the grating mirror 120 and facilitate propagation of light, which is coupled between the grating mirror 120 and the optical waveguide 130.

The low refractive index layer 140 may be, for example, a silicon oxide ($SiO_2$) layer. Alternatively, the low refractive index layer 112 may be formed of zirconium oxide ($ZrO_2$), titanium oxide ($TiO_2$), magnesium oxide (MgO), cesium oxide ($CeO_2$), aluminum oxide ($Al_2O_3$), hafnium oxide, niobium oxide (NbO), or silicon nitride ($Si_3N_4$). The low-n layer 140 may be referred to as a second insulating layer.

The Group III-V semiconductor layer 150 may be disposed on the second insulating layer 140 and may include, for example, an n-type Group III-V semiconductor layer 151, an active layer 152, and a p-type Group III-V semiconductor layer 153 formed on the second insulating layer 140. The Group III-V semiconductor layer 150 may be formed, for example, of indium phosphide (InP) or gallium arsenide (GaAs). However, example embodiments are not limited thereto.

The p-type Group III-V semiconductor layer 153 may include a current blocking layer 155 with an aperture 156 through which light passes. The current blocking layer 155 may be formed, for example, by proton implantation or thermal oxidation of aluminum (Al) in a region corresponding to the current blocking layer 155.

The top mirror 160 is disposed on the p-type Group III-V semiconductor layer 153 and reflects light generated in the active layer 152 toward the underlying grating mirror 120 so that the light resonates between the top mirror 160 and the grating mirror 120. In example embodiments, the top mirror 160 may have a Distributed Bragg reflector (DBR) structure with maximum reflectance at a desired resonance wavelength $\lambda$.

The top mirror 160 may be formed from as few as a single reflective layer or from a stack of alternating layers of two materials with different refractive indices. In the latter case, the alternating layers may have a thickness of about one quarter of the desired resonance wavelength $\lambda$ (e.g., $\lambda/4$). For example, the DBR structure may consist of a plurality of alternating one-quarter-wavelength ($\lambda/4$) thick layers of $Al_xGa_{(1-x)}As$ and $Al_yGa_{(1-y)}As$ ($0 \leq x \leq 1$, $0 \leq y \leq 1$, and $x \neq y$).

While the top mirror 160 may have a DBR structure, it is not limited thereto. For example, the top mirror 160 may have the same structure as the grating mirror 120. In example embodiments, the alternating layers may have different thicknesses depending on, for example, the materials from which the layers are made.

The top mirror 160 and the Group III-V semiconductor layer 150 may be doped with desired (and/or alternatively predetermined) impurities in order to allow for current injection. An electrode for injecting current, e.g., a p-type electrode 171 may be mounted on the top mirror 160 so as to cover a top surface of the top mirror 160. The p-type electrode 171 may be formed of a highly reflective metal such as Al, for example.

The n-type Group III-V semiconductor layer 151 may have one or more edges exposed by the active layer 152, and n-type electrodes 172 may be disposed on the edge(s) of the n-type Group III-V semiconductor layer 151.

According to example embodiments, a method of manufacturing the hybrid vertical cavity laser 100 for the PIC may include forming the SOI substrate 102 including the grating mirror 120, forming an upper structure including the Group III-V semiconductor layer 150, forming a first structure in which the second insulating layer 140 is disposed on the n-type Group III-V semiconductor layer 151 of the upper structure, and bonding the first structure onto the SOI substrate 102.

When current is injected into the Group III-V semiconductor layer 150 through the p- and n-type electrodes 171 and 172, electrons and holes may recombine in the active layer 152, allowing a laser beam to be generated. The intensity of light emitted from the active layer 152 due to the electron-hole recombination increases as the light reciprocates between the top mirror 160 and the grating mirror 120.

When the intensity of the light reaches a given intensity, laser light is emitted from the grating mirror 120 with a lower reflectance than that of the top mirror 160. The emitted light is diffracted and propagate in a horizontal direction to other optical elements (not shown) through the optical waveguide 130.

According to example embodiments, the grating mirror 120 may include a plurality of bar-shaped low-n material portions 121 and 122 that have a refractive index lower than that of portions 124 of the material layer 114. The portions 124 of the material layer 114 may be made of a same material as the material layer 114. Thus, the portions of the material layer 124 may be made of silicon when the material layer 114 is a silicon layer 114. The low-n material portions 121 and 122 may be arranged, for example, a bar- or striped-shaped pattern, and the plurality of low-n material portions 121 and 122 may be arranged parallel to one another.

The grating mirror 120 may also be referred to as a high index contrast grating (HCG). In other words, the grating mirror 120 may have a large refractive index difference between the low-n material portions 121 and 122 and the portions 124 of the silicon layer 114. The low-n material portions 121 and 122 may be formed, for example, by etching the top silicon layer 114 of the SOI substrate 102. In other words, the top silicon layer 114 (or material layer 114) may be etched to define a pattern that includes a plurality of first openings $O_1$, a plurality of second openings $O_2$, and includes optical waive guide 130 and the portions 124 in the grating mirror 120. The plurality of first and second openings $O_1$ and $O_2$ may expose the underlying low refractive index layer 112.

Materials for the low-n material portions 121 and 122 may be in the first and second openings $O_1$ and $O_2$. The low-n material portions 121 and 122 may be air layers or may be filled with a material having a lower refractive index than that of the portions 124 of the material layer 114 (e.g., silicon), such as silicon oxide. Alternatively, the low-n material portions 121 and 122 may be formed of zirconium oxide ($ZrO_2$), titanium oxide ($TiO_2$), magnesium oxide (MgO), cesium oxide ($CeO_2$), aluminum oxide ($Al_2O_3$), hafnium oxide ($HfO_2$), niobium oxide (NbO), silicon nitride ($Si_3N_4$), or an organic material such as a polymer (e.g., BCB). As discussed above, the material layer 114 may be silicon nitride ($Si_3N_4$) so the low-n material portions 121 and 122 cannot be silicon nitride ($Si_3N_4$) when the material layer 114 is silicon nitride ($Si_3N_4$) because the low-n material portions have a lower refractive index than the material layer 114.

The low-n material portions 121 and 122 may have a first width W1 and a second width W2 respectively, and portions of the silicon layer 124 between the low-n material portions 121 and 122 may have a constant (and/or substantially constant) width W. In example embodiments, the second width W2 may be about 10 nm to about 50 nm greater than the first width W1. This width difference may vary depending on, for example, the desired wavelength of the output laser beam and may be realized by varying one or both of the first and second widths W1 and W2.

The low-n material portions 121 and 122 may be alternately arranged, for example, as illustrated in FIG. 2. The low-n material portion 122 with the second width W2 may increase the amount of diffraction of a laser beam, thereby enhancing the efficiency of optical coupling with the optical waveguide 130. While the smaller width portion 121 is shown adjacent to the optical waveguide 130, example embodiments are not limited thereto and the thicker portion 122 may alternatively be adjacent to the optical waveguide 130.

Figure 3:
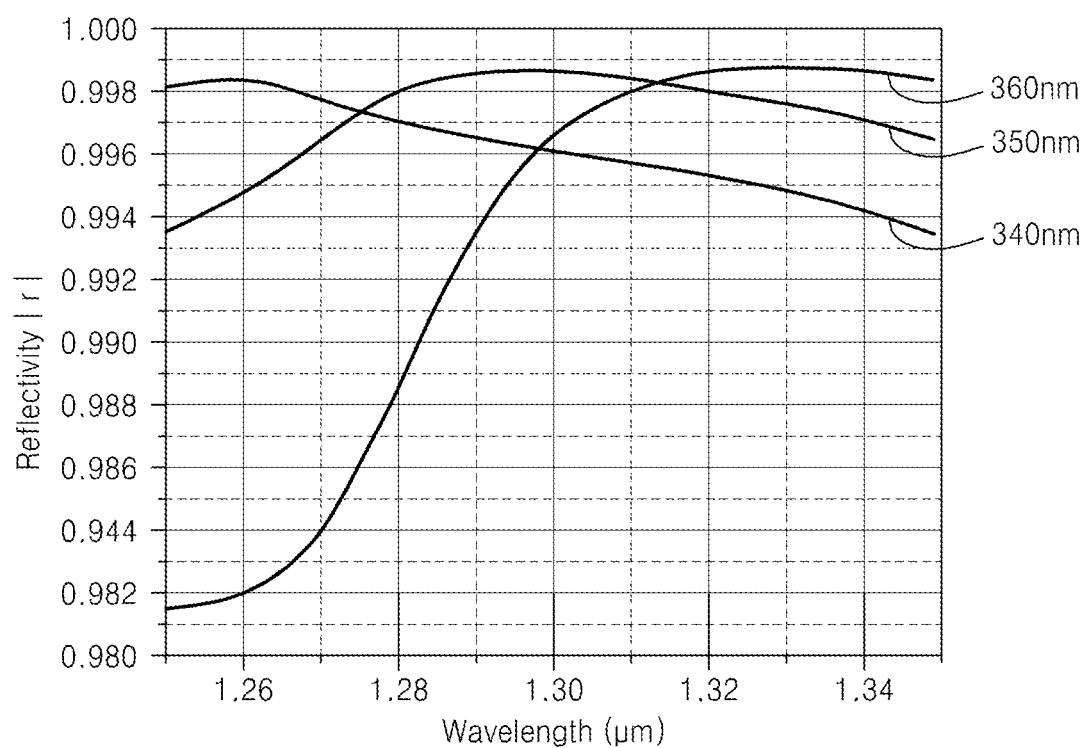
FIG. 3 is a graph simulating an example of the reflectivity of the grating mirror in the hybrid vertical cavity laser for a PIC of FIG. 1.

FIG. 3 is a graph simulating an example of the reflectivity |r| of the grating mirror 120 in the hybrid vertical cavity laser 100 for the PIC. In this example, the grating mirror 120 is designed in a transverse magnetic mode. The first and second insulating layers 112 and 140 used in the simulation are silicon oxide layers, and the low-n material portions 121 and 122 are air layers. The Group III-V semiconductor layer 150 is formed of InP. The first and second insulating layers 112 and 140 have heights of 1000 nm and 200 nm respectively. The low-n material portions 121 and 122 have a height of 350 nm. The first and second widths W1 and W2 of the low-n material portions 121 and 122 are 170 nm and 190 nm, respectively. The width W of the silicon layer 124 disposed between the low-n material portions 121 and 122 is adjusted to 340 nm, 350 nm, and 360 nm.

Referring to FIG. 3, the grating mirror 120 may be designed to achieve a high reflectivity of more than 99.8% at a 1300 nm wavelength used for optical communications.

Figure 4:
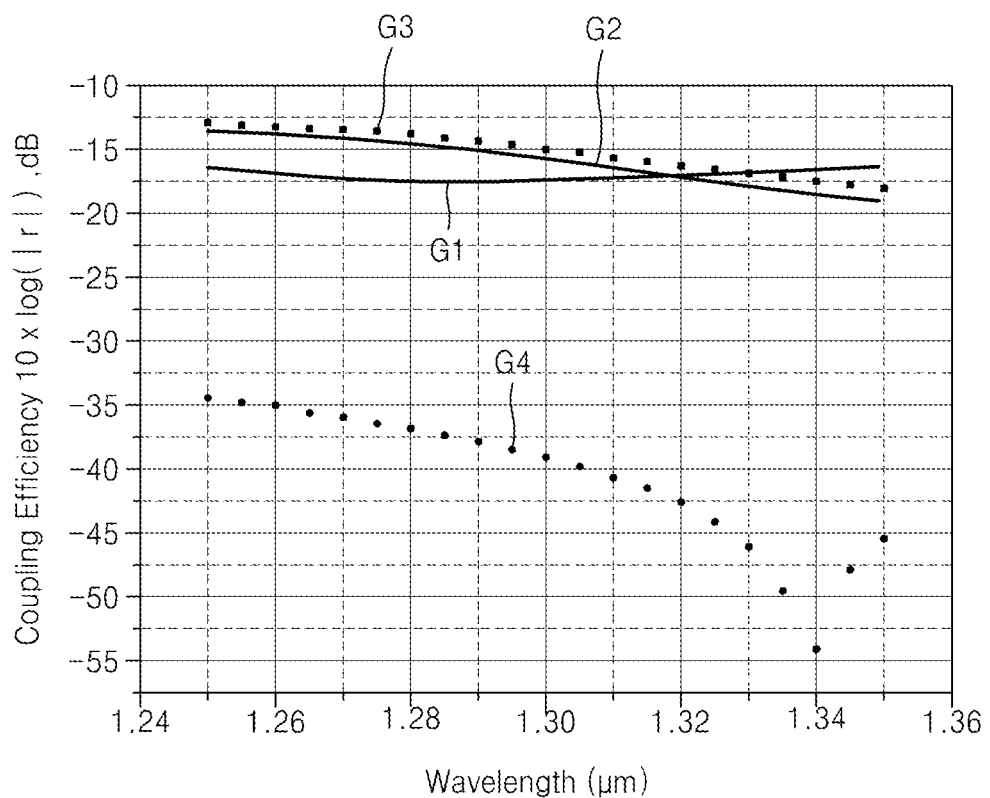
FIG. 4 is a graph simulating an example of the coupling efficiency of the grating mirror in the hybrid vertical cavity laser for a PIC of FIG. 1.

FIG. 4 is a graph simulating an example of the coupling efficiency of a grating mirror 120 according to example embodiments. First and second widths W1 and W2 of the low-n material portions 121 and 122 are 170 nm and 190 nm, respectively, and a width W of the silicon layer 124 is 350 nm. Other conditions are the same as described with reference to FIG. 3.

In FIG. 4, the coupling efficiency of a grating mirror 122 according to example embodiments is provided with the result of simulating a coupling efficiency of another type of grating mirror. In this other type of grating mirror, a silicon layer that have a width of 355 nm is disposed between low-n material portions and the low-n material portions have a width of 180 nm. Other conditions or dimensions are the same as described with reference to FIG. 3.

Referring to FIG. 4, curves G1 and G2 respectively represent the reflectivity of the grating mirror 120 for first-order diffraction and reflectivity thereof for second-order diffraction. Curves G3 and G4 respectively show the reflectivity of the other type of grating mirror for first-order diffraction and the reflectivity thereof for second-order diffraction.

As is apparent from FIG. 4, the reflectivity for the second-order diffraction contributes to optical coupling efficiency more than the reflectivity for the first-order diffraction. Referring to FIG. 4, as indicated by the curve G4, an optical coupling efficiency of the other type of grating mirror is low due to its low reflectivity for the second-order diffraction. Conversely, an optical coupling efficiency of a grating mirror 120 according to example embodiments is increased over the other type of grating mirror due to its high reflectivity for the second-order diffraction, as indicated by the curve G2. The low-n material portion 122 may serve to increase the amount of diffraction of a laser beam, thereby enhancing the efficiency of optical coupling with the optical waveguide 130.

Thus, the hybrid vertical cavity laser 100 for the PIC including the grating mirror 120 according to the example embodiments provides improved efficiency of optical coupling with the optical waveguide 130 and reduced power consumption for an optical interconnection.

Figure 5:
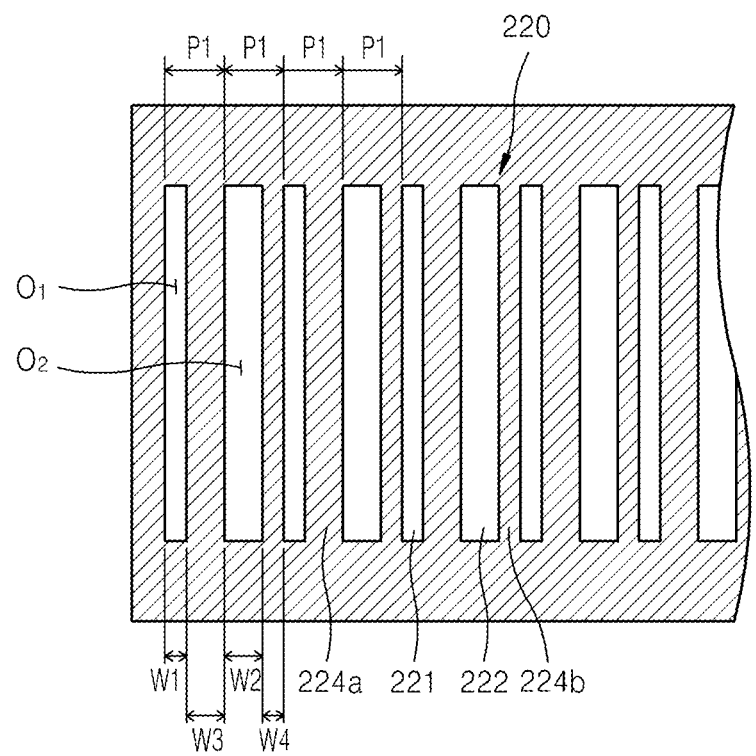
FIG. 5 is a schematic plan view of a portion of a grating mirror in a hybrid vertical cavity laser for a PIC according to example embodiments.

FIG. 5 is a schematic plan view of a portion of a grating mirror 220 in a hybrid vertical cavity laser for the PIC according to example embodiments. The remaining structure of the hybrid vertical cavity laser for the PIC related to FIG. 5, excluding the grating mirror 220, may be the same as (or substantially the same as) that of the hybrid vertical cavity laser 100 in FIG. 1. Thus, a detailed description thereof will be omitted herein.

Referring to FIG. 5, a material layer such as a top silicon layer of a silicon-on-insulator substrate (see material layer 114 in FIG. 1) may be patterned to define a plurality of portions 224a and 224b of a grating mirror 220, a plurality of first openings $O_1$, and a plurality of second openings $O_2$. The plurality of first and second openings $O_1$ and $O_2$ may expose an underlying low refractive index layer (see FIG. 1, item 112). A plurality of low-n material portions 221 and 222 may be arranged in the plurality of first and second openings $O_1$ and $O_2$ respectively. The plurality of low-n material portions 221 and 222 may be arranged at a constant (and/or substantially constant) pitch P1. The plurality of low-n material portions 221 and 222 include low-n material portions 221 with a first width W1 and low-n material portions 222 with a second width W2. The second width W2 may be about 10 nm to about 50 nm greater than the first width W1.

The low-n material portions 221 of the first width W1 may be alternately arranged with the low-n material portion 222 of the second width W2. Alternating ones of the plurality of portions 224a and 224b may be disposed between the low-n material portions 221 and 222. The plurality of portions 224a and 224b may be made of silicon or another material. The low-n material portions 221 and 222 may be filled with a material having a refractive index that is lower than a material of the plurality of portions 224a and 224b of the grating mirror 220. For example, when the plurality of portions 224a and 224b are silicon, the low-n material portions 221 and 222 may include air or silicon oxide. Alternatively, the low-n material portions 221 and 222 may be formed of zirconium oxide ($ZrO_2$), titanium oxide ($TiO_2$), magnesium oxide (MgO), cesium oxide ($CeO_2$), aluminum oxide ($Al_2O_3$), hafnium oxide ($HfO_2$), niobium oxide (NbO), silicon nitride ($Si_3N_4$), or an organic material such as a polymer (e.g., BCB). As discussed above, the material layer used to form the plurality of portions 224a and 224b may be silicon nitride ($Si_3N_4$) so the low-n material portions 221 and 222 cannot be silicon nitride ($Si_3N_4$) when the plurality of portions 224a and 224b are silicon nitride because the low-n material portions 221 and 222 have a lower refractive index than the plurality of portions 224a and 224b.

An example where the low-n material portions 221 and 222 are air layers and the plurality of portions 224a and 224b are silicon is described hereinafter.

In terms of pitch P1, the portion of the silicon layer 224a disposed between the low-n material portion 221 of the first width W1 and the low-n material portion 222 of the second width W2 has a third width W3, while the portion of the silicon layer 224b between the low-n material portion 222 of the second width W2 and the low-n material portion 221 of the first width W1 has a fourth width W4. The third width W3 is greater than the fourth width W4 by a width difference (W1−W2) between the two adjacent low-n material portions 221 and 222.

The width difference between the third width W3 and the fourth width W4 may be, for example, about 10 nm to about 50 nm. Thus, the pitch P1 between the low-n material portions 221 and 222 may remain constant (and/or substantially constant). Operation of the grating mirror 220 may be similar to the operation of the grating mirror 120 described previously, and thus the operation of the grating mirror 220 is omitted.

Figure 6:
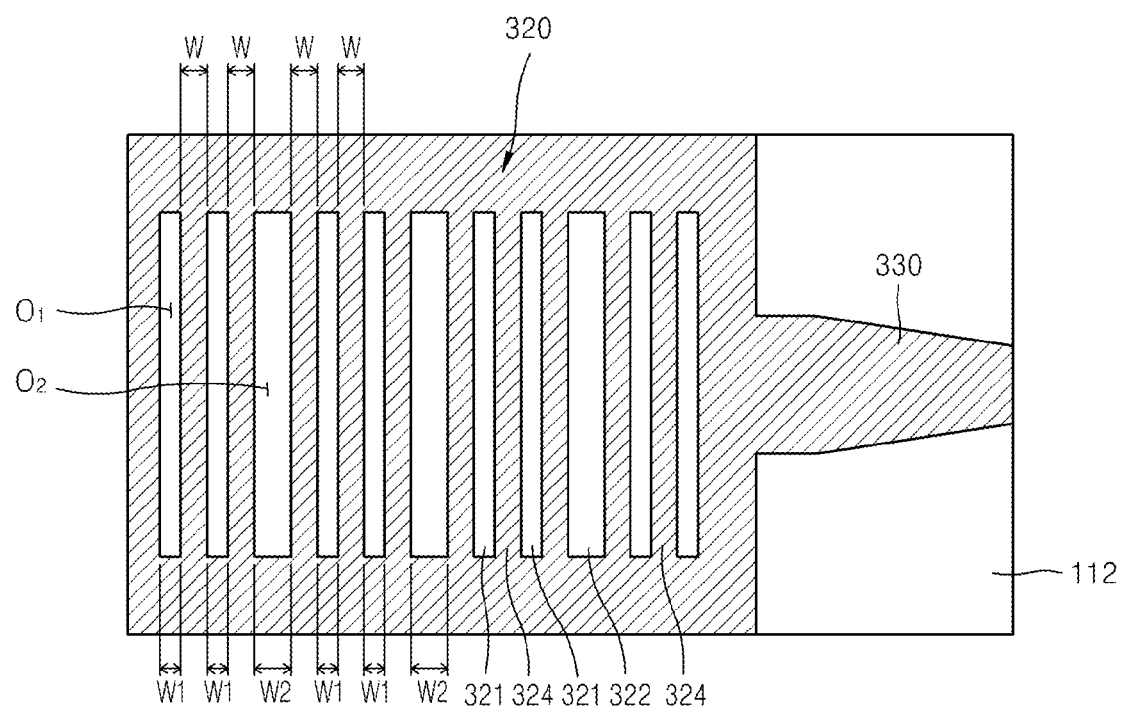
FIG. 6 is a schematic plan view of a portion of a grating mirror in a hybrid vertical cavity laser for a PIC according to example embodiments.

FIG. 6 is a schematic plan view of a portion of a grating mirror 320 in a hybrid vertical cavity laser for the PIC according to example embodiments. In FIG. 6, the same reference numerals are used to denote the same elements as shown in FIG. 1, and detailed descriptions thereof will be omitted herein.

Referring to FIG. 6, the grating mirror 320 includes a plurality of low-n material portions 321 and 322 that are arranged parallel to one another. The low-n material portions 321 and 322 may be formed, for example, by etching the top silicon layer (114 in FIG. 1) of the SOI substrate (102 in FIG. 1) to define a plurality of first openings $O_1$ and a plurality of second openings $O_2$ that are alternately arranged between a plurality of portions 324 of the grating mirror 320, and an optical waveguide 330 coupled to a side of the grating mirror 320. Then the low-n material portions 321 and 322 may be filled in the plurality of first and second openings $O_1$ and $O_2$. Similar to the material layer 114 described previously with regard to FIGS. 1-2, a material of the plurality of portions 324 may alternatively be a dielectric material having a relatively high refractive index, such as silicon nitride ($Si_3N_4$), instead of a top silicon layer of the SOI substrate.

The low-n material portions 321 and 322 may be filled with a material having a refractive index that is lower than a material of the plurality of portions 324 of the grating mirror 320. For example, when the plurality of portions 324 are silicon, the low-n material portions 321 and 322 may be air or filled with silicon oxide. Alternatively, the low-n material portions 321 and 322 may be formed of zirconium oxide ($ZrO_2$), titanium oxide ($TiO_2$), magnesium oxide (MgO), cesium oxide ($CeO_2$), aluminum oxide ($Al_2O_3$), hafnium oxide ($HfO_2$), niobium oxide (NbO), silicon nitride ($Si_3N_4$), or an organic material such as a polymer (e.g., BCB). As discussed above, the plurality of portions 324 may be silicon nitride ($Si_3N_4$) so the low-n material portions 321 and 322 cannot be silicon nitride ($Si_3N_4$) when the plurality of portions 324 are silicon nitride because the low-n material portions 321 and 322 have a lower refractive index than the plurality of portions 324.

Hereinafter, the low-n material portions 321 and 322 are also referred to as air layers.

The plurality of low-n material portions 321 and 322 include the low-n material portions 321 with a first width W1 and the low-n material portions 322 with a second width W2.

The second width W2 may be, for example, about 10 nm to about 50 nm greater than the first width W1. Widths of the plurality of portions 324 between the low-n material portions 321 and 322, and between two low-n material portions 321 and 322, may be the same with a width W.

Thus, in example embodiments, the grating mirror 320 may be different pitches based on the different widths W1 and W2. For example, the spacing between portion 121 and 122 is equal to the sum of W1 and W, where the spacing between portion 122 and 121 is equal to the sum of W2 and W.

Also, according to example embodiments, one low-n material portion 322 having the second width W2 may be provided for every two low-n material portions 321 having the first width W1. The low-n material portion (or air layer) 322 with the second width W2 serves to increase the amount of diffraction of a laser beam, thereby enhancing the efficiency of optical coupling with an optical waveguide 330.

While FIG. 6 shows that one air layer 322 having the second width W2 is provided for every two air layers 322 having the first width W1, example embodiments are not limited thereto. For example, the grating mirror 320 may be arranged so less than N number of air layers 322 having the second width W2 are provided for every N number of air layers 321 having the first width W1, and N may be an integer greater than or equal to 3.

Figure 7:
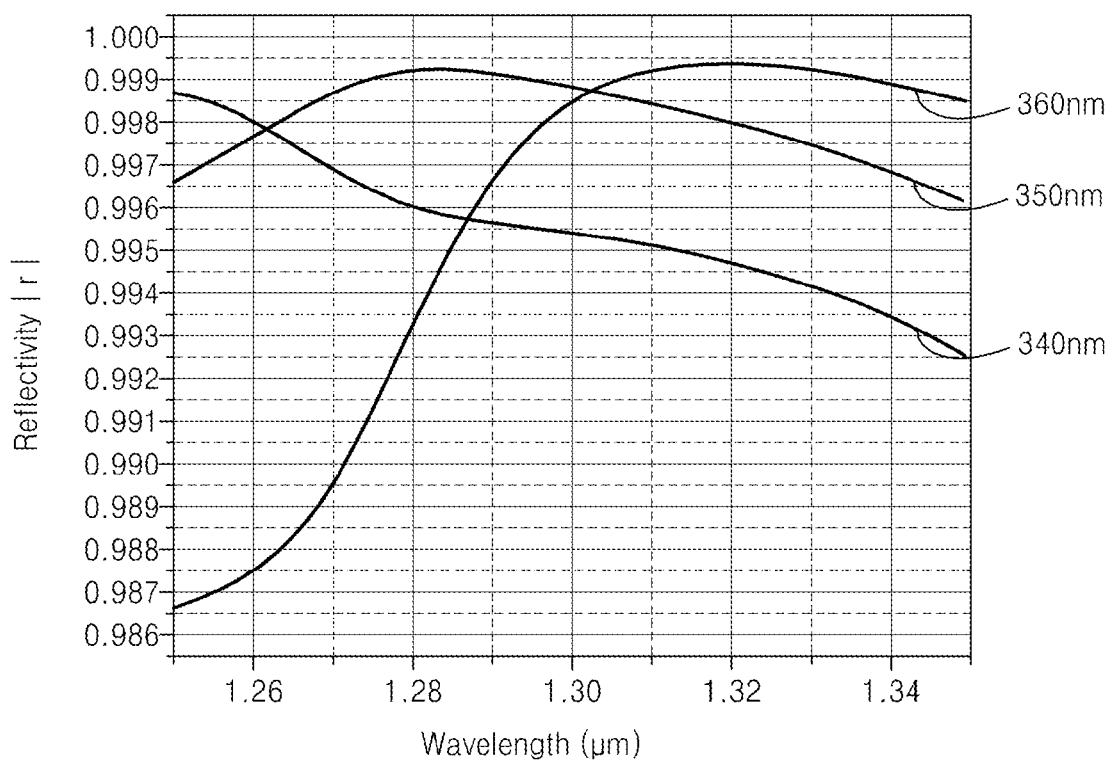
FIG. 7 is a graph simulating an example of the reflectivity of the grating mirror of FIG. 6.

FIG. 7 is a graph simulating an example of the reflectivity of the grating mirror 320 of FIG. 6. The grating mirror 320 may be designed in a transverse magnetic mode. The first and second insulating layers (112 and 140 in FIG. 1) used in the simulation are silicon oxide layers, and the low-n material portions 321 and 322 are air layers. The Group III-V semiconductor layer 1 (150 in FIG. 1) is formed of InP.

Also, the first insulating layer 120, the low-n material portion 322, and the second insulating layer 140 have heights of 1000 nm, 350 nm, and 200 nm, respectively. The first and second widths W1 and W2 of the low-n material portions (air layers) 321 and 322 are 170 nm and 190 nm, respectively. The width W of the silicon layer 324 disposed between the low-n material portions 321 and 322 is adjusted to 340 nm, 350 nm, and 360 nm, respectively.

Referring to FIG. 7, according to example embodiments, the grating mirror 320 in the hybrid vertical cavity laser for the PIC may be designed to achieve a high reflectivity of more than 99.8% at a 1300 nm wavelength used for optical communications.

Figure 8:
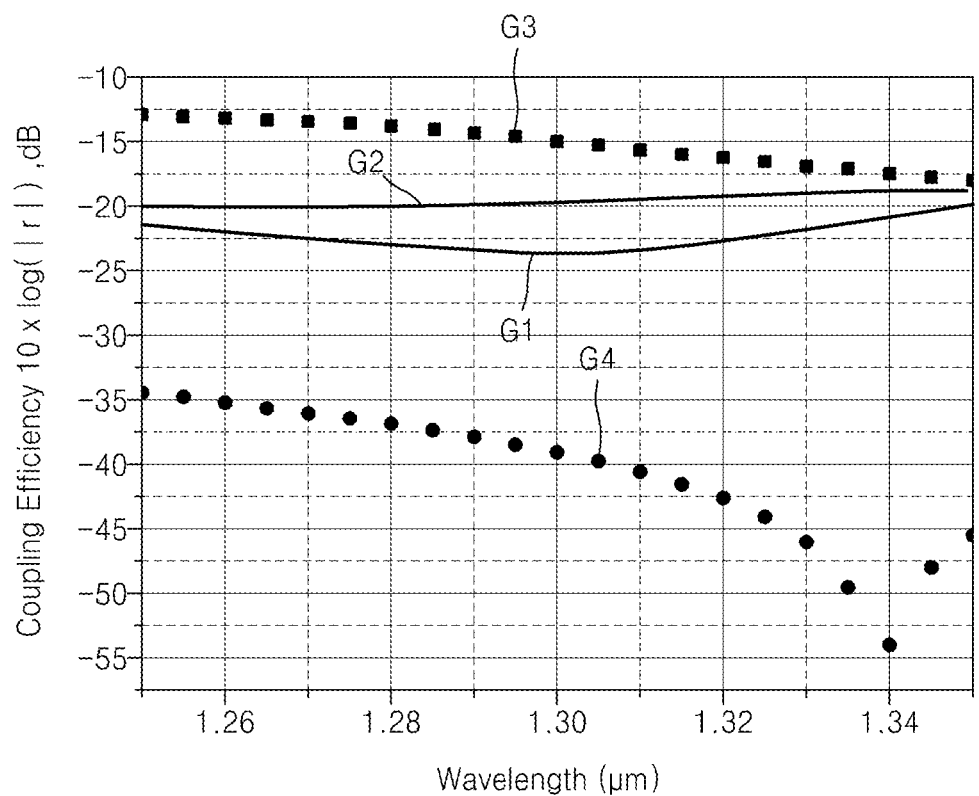
FIG. 8 is a graph simulating an example of the coupling efficiency of the grating mirror of FIG. 6.

FIG. 8 is a graph simulating an example of the coupling efficiency of the grating mirror 320 in the hybrid vertical cavity laser for the PIC according to example embodiments. The width W of the silicon layer 324 between the low-n material portions 321 and 322, the first width W1, and the second width W2 are 350 nm 170, and 190 nm, respectively. Other conditions are the same as those used in the simulation with reference to FIG. 7.

Also, FIG. 8 illustrates an example of the result of simulating a the coupling efficiency of another type of grating mirror. In the other type of grating mirror, a silicon layer disposed between low-n material portions (air layers) has a width of 355 nm, and the low-n material portions have a width of 180 nm. Other conditions or dimensions are the same as described with reference to FIG. 7.

Referring to FIG. 8, curves G1 and G2 respectively represent the reflectivity of the grating mirror 320 for the first-order diffraction and reflectivity thereof for the second-order diffraction. Curves G3 and G4 respectively show the reflectivity of the other type of grating mirror for the first-order diffraction and the reflectivity thereof for the second-order diffraction.

As evident from FIG. 8, the reflectivity for the second-order diffraction contributes to optical coupling efficiency more than the reflectivity for the first-order diffraction. Referring to FIG. 8, as indicated by the curve G4, an optical coupling efficiency of the other type of grating mirror is very low due to its extremely low reflectivity for the second-order diffraction.

Conversely, an optical coupling efficiency of the grating mirror 320 according to example embodiments may be increased over the 1 other type of grating mirror due to its high reflectivity for the second-order diffraction, as indicated by the curve G2. The low-n material portion 322 with the second width W2 serves to increase the amount of diffraction of a laser beam, thereby enhancing the efficiency of optical coupling with the optical waveguide 330.

Thus, the hybrid vertical cavity laser for the PIC including the grating mirror 320 according to example embodiments provides improved efficiency of optical coupling with the optical waveguide 330 and reduced power consumption for an optical interconnection.

Figure 9:
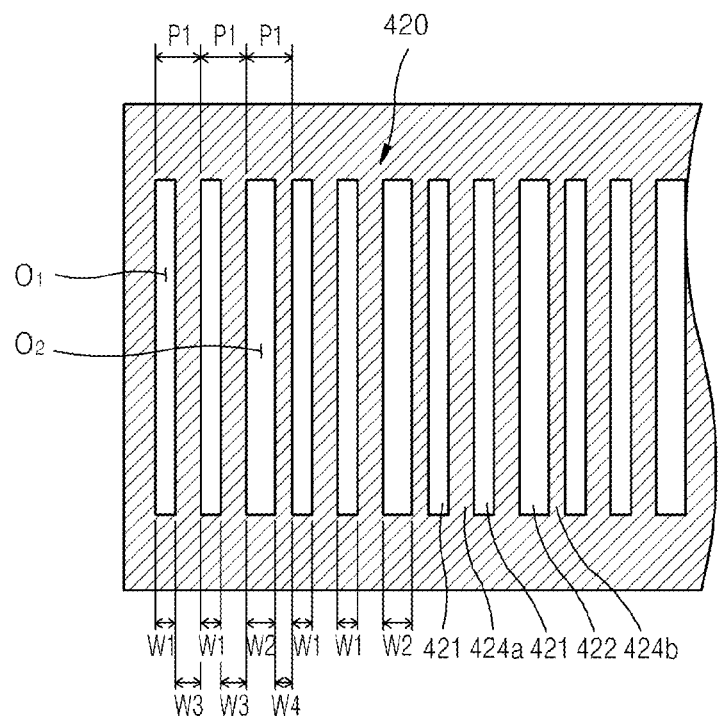
FIG. 9 is a schematic plan view of a portion of a grating mirror in a hybrid vertical cavity laser for a PIC according to example embodiments.

FIG. 9 is a schematic plan view of a portion of a grating mirror 420 in a hybrid vertical cavity laser according to example embodiments. Referring to FIG. 9, a material layer such as a top silicon layer of a silicon-on-insulator substrate (see material layer 114 in FIG. 1) may be patterned to define a plurality of portions 424a and 424b of a grating mirror 420, a plurality of first openings $O_1$, and a plurality of second openings $O_2$. The plurality of first and second openings $O_1$ and $O_2$ may expose an underlying low refractive index layer (see FIG. 1, item 112). A plurality of low-n material portions 421 and 422 of the grating mirror 420 may be arranged at a constant (and/or substantially constant) pitch P1. The plurality of low-n material portions 421 and 423 may include low-n material portions 421 with a first width W1 and low-n material portions 422 with a second width W2. The second width W2 may be about 10 nm to about 50 nm greater than the first width W1. The plurality of low-n material portions 421 and 423 may fill the plurality of first and second openings $O_1$ and $O_2$ respectively.

As shown in FIG. 9, one low-n material portion 422 having the second width W2 is provided for every two low-n material portions 321 having the first width W1. However, example embodiments are not limited thereto. The low-n material portions 421 and 422 may filled with a material having a refractive index that is lower than a refractive index of the of the plurality of portions 424a and 424b in the grating mirror 420. For example, when the plurality of portions 424a and 424b are silicon, the low-n material portions 421 and 422 may be air or silicon oxide. Alternatively, the low-n material portions 421 and 422 may be formed of zirconium oxide ($ZrO_2$), titanium oxide ($TiO_2$), magnesium oxide (MgO), cesium oxide ($CeO_2$), aluminum oxide ($Al_2O_3$), hafnium oxide ($HfO_2$), niobium oxide (NbO), silicon nitride ($Si_3N_4$), or an organic material such as a polymer (e.g., BCB). As discussed above, the material layer used to form the plurality of portions 424a and 424b may be silicon nitride ($Si_3N_4$) so the low-n material portions 421 and 422 cannot be silicon nitride ($Si_3N_4$) when the plurality of portions 424a and 424b are silicon nitride because the low-n material portions 421 and 422 have a lower refractive index than the plurality of portions 424a and 424b.

The low-n material portions 421 and 422 are hereinafter assumed to be air layers. Also, an example where the plurality of portions 424a and 424b are silicon is hereinafter described.

The silicon portion 424a at the right side of the low-n material portion 421 having the first width W1 has a third width W3 while the silicon portion 424b at the right side of the low-n material portion 422 having the second width W2 has a fourth width W4. The third width W3 is greater than the fourth width W4 by a width difference (W1–W2) between the first and second widths W1 and W2. The width difference may be about 10 nm to 50 nm. Operation of the grating mirror 420 may be substantially the same as operation of the grating mirror 320.

In example embodiments, less than N low-n material portions 422 having the second width W2 may be arranged for every N layers 421 having the first width W1 (N is an integer greater than or equal to 3).

Figure 10:
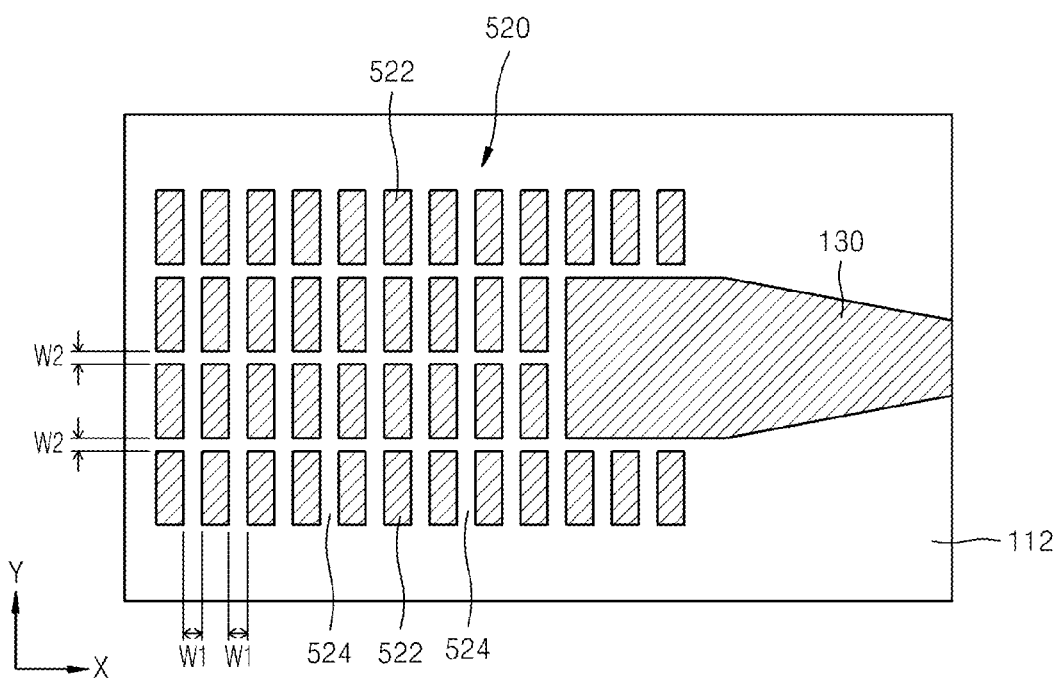
FIG. 10 is a schematic plan view of a portion of a grating mirror in a hybrid vertical cavity laser for a PIC according to example embodiments.

FIG. 10 is a schematic plan view of a portion of a grating mirror 520 in a hybrid vertical cavity laser for the PIC according to example embodiments. In this figure, the same reference numerals are used to denote the same elements as in FIG. 1.

Referring to FIG. 10, the grating mirror 520 includes a plurality of silicon sections 522. The sections may have the same or different shapes. In the example shown, the sections have a bar shape which are arranged parallel to each other to form an array. However, the sections may be offset from one another, for example, on a row-by-row or column-by-column basis.

The silicon bars 522 may be formed, for example, by etching the top silicon layer (114 in FIG. 1) of the SOI substrate (102 in FIG. 1). A space between the silicon bars 522 may be filled with an air layer or a material having a refractive index lower than, for example, silicon such as silicon oxide. A transverse width W1 between the silicon bars 522 may be about 210 nm while a longitudinal width W2 between the silicon bars 522 may be about 100 nm.

The silicon bars 522 may be arranged parallel to each other in both X and Y directions, or in only one of those directions, and may be spaced apart from each other at desired (or alternatively predetermined) distances or intervals.

Figure 11:
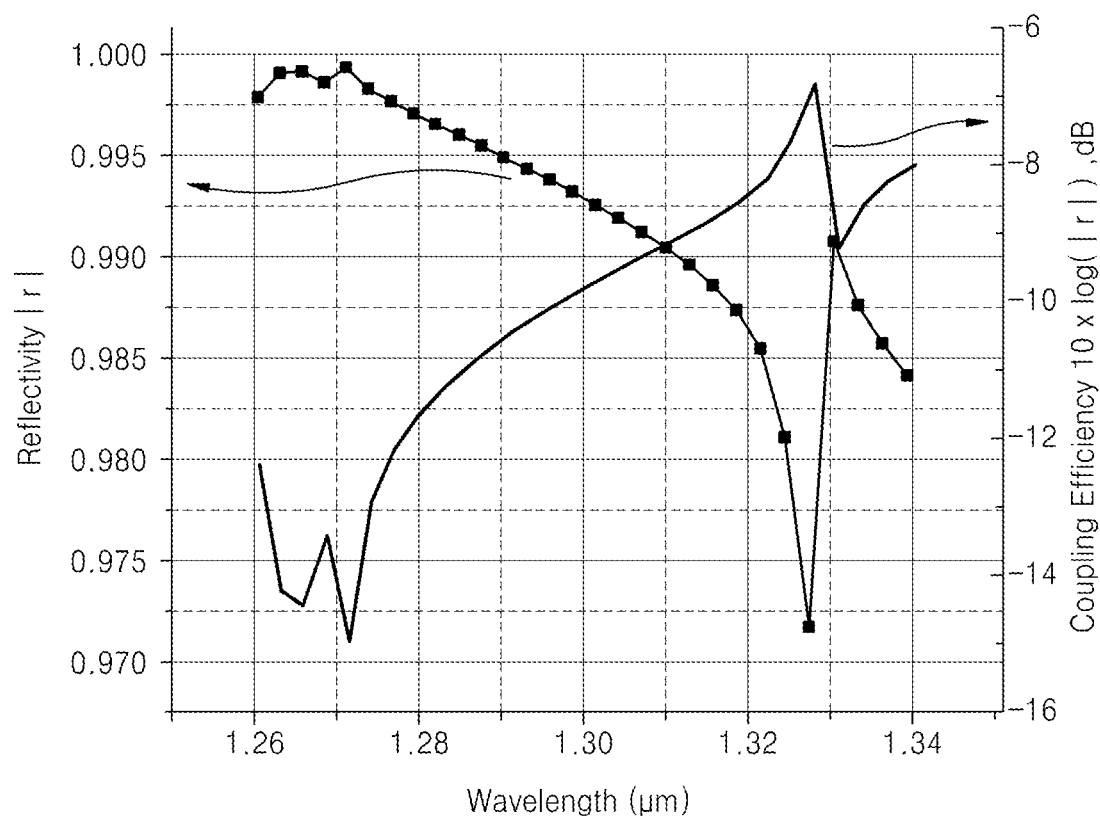
FIG. 11 is a graph simulating an example of the reflectivity and coupling efficiency of the grating mirror of FIG. 10.

FIG. 11 is a graph simulating an example of the reflectivity and coupling efficiency of the grating mirror 520 of FIG. 10. The grating mirror 520 may be designed to operate in transverse magnetic mode. The first and second insulating layers (e.g., layers 112 and 140 in FIG. 1) in this example are silicon oxide layers and a low-n material portion 524 is an air layer. The Group III-V semiconductor layer (150 in FIG. 1) is formed of InP. The first insulating layer (120 in FIG. 1), the low-n material portion 524, and the second insulating layer 140 have heights of 1000 nm, 355 nm, and 200 nm, respectively. The transverse width (W1 in FIG. 10) and the longitudinal width (W2 in FIG. 10) between the silicon bars 522 are about 210 nm and 100 nm, respectively. A width and a length of each silicon bar 522 may be about 300 nm and 1200 nm, respectively.

Referring to FIG. 11, according to example embodiments, the grating mirror 520 in the hybrid vertical cavity laser for the PIC may achieve a reflectivity of more than 99% at a 1300 nm wavelength used for optical communications. As apparent from FIG. 11, the coupling efficiency is about 10 dB at a 1300 nm wavelength, which means a large amount of light is diffracted for coupling.

Figure 12:
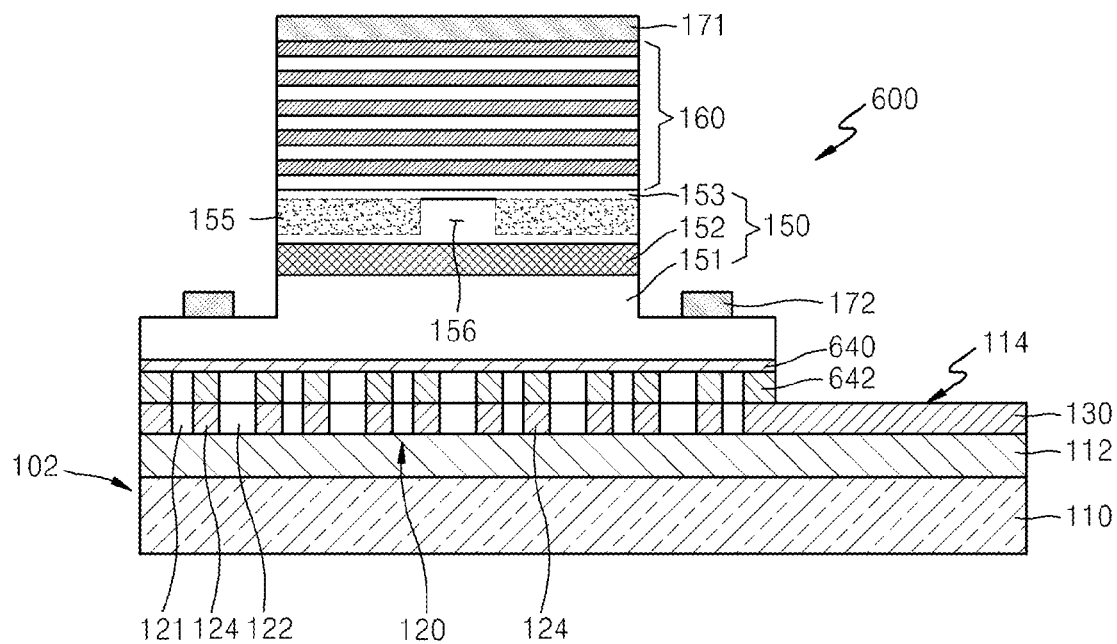
FIG. 12 is a schematic cross-sectional view of a hybrid vertical cavity laser for a PIC according to example embodiments.

FIG. 12 is a schematic cross-sectional view of a hybrid vertical cavity laser 600 for the PIC according to example embodiments. In this figure, the same reference numerals are used to denote the same elements as shown in FIG. 1.

Referring to FIG. 12, a third insulating layer 642 is disposed on a the portions 124 of the grating mirror 120 and may have a shape of the grating mirror 120. In other words, a pattern of the third insulating layer 642 may correspond to a pattern of the portions 124 of the material layer 114. For example, after forming an insulating layer on a SOI substrate 120, the insulating layer and the material layer 114 (e.g., silicon layer 114) may be etched together to form the grating mirror 120 and the third insulating layer 642. The resulting structure is hereinafter may be referred to as a first structure.

The third insulating layer 642 may have a refractive index that is less than a refractive index of the portions 124 of the material layer 114. For example, when the portions 124 and the material layer 114 are silicon, the third insulating layer 642 may be formed of silicon oxide. The third insulating layer 642 may have a height of about 300 nm to about 350 nm.

A fourth insulating layer 640 overlies the third insulating layer 642 and may have a height of about 20 nm to 50 nm. The fourth insulating layer 640 may have a refractive index that is less than a refractive index of the portions 124 of the material layer 114. For example, when the portions 124 and the material layer 114 are silicon, the fourth insulating layer 640 may also be formed of silicon oxide.

Following formation of an upper structure including a semiconductor layer 150 and a stack on the semiconductor 150, the fourth insulating layer 640 is disposed on an n-type Group III-V semiconductor layer 151. The resulting structure is referred to as a second structure.

The first structure including the grating mirror 120 may be bonded or otherwise coupled to the second structure in the hybrid vertical cavity laser 600. The structure of the third and fourth insulating layers 642 and 640 on the grating mirror 120 may also apply to the structures shown in FIGS. 5, 6, 9, and 10, and a detailed description thereof will be omitted herein.

In other words, in example embodiments, the grating mirror 120 in FIG. 12 may be substituted with one of the grating mirrors 220, 320, 420, and 520 described previously in FIGS. 5, 6, 9, and 10, or one of the grating mirrors 320' and 420' described below in FIGS. 13-14. When the grating mirror 120 in FIG. 12 is substituted with one of the grating mirrors 220, 320, 420, and 520 described previously and one of the grating mirrors 320' and 420' described below, a shape (or pattern) of the of third insulating layer 642 may be modified to correspond with the pattern of the corresponding grating mirror 220, 320, 320', 420, 420' and 520.

In accordance with example embodiments, a hybrid vertical cavity laser for a PIC may increase the amount of a laser beam secondly diffracted by a silicon grating mirror and improve efficiency of optical coupling into an optical waveguide (e.g., silicon optical waveguide) disposed at one side of the grating mirror. As a result, power consumption for optical interconnections may be reduced.

While some example embodiments have been particularly shown and described, it will be understood by one of ordinary skill in the art that variations in form and detail may be made therein without departing from the spirit and scope of the claims.

What is claimed is:

1. A hybrid vertical cavity laser for a photonic integrated circuit (PIC), the laser comprising:
   a first low refractive index layer;
   a second low refractive index layer on the first low refractive index layer;
   a grating mirror between the first and second low refractive index layers,
      the grating mirror including a material layer,
      the first and second low refractive index layers each having refractive indices that are lower than a refractive index of the material layer,
      the grating mirror including a plurality of low refractive index material portions in the material layer, the plurality of low refractive index material portions being arranged parallel to each other and each having a bar shape, the plurality of low refractive index material portions extending in a first direction, the plurality of low refractive index material portions each having a lower refractive index than the refractive index of the material layer, the plurality of low refractive index material portions including a plurality of first portions having a first width in a second direction and a plurality of second portions having a second width in the second direction, the second width being different than the first width;

an optical waveguide optically coupled to one side of the grating mirror in the second direction, the second direction being perpendicular to the first direction;

a Group III-V semiconductor layer on the second low refractive index layer, the Group III-V semiconductor layer including an active layer; and a top mirror on the Group III-V semiconductor layer.

2. The laser of claim 1, wherein the material layer is a silicon layer.

3. The laser of claim 1, wherein a material of the plurality of low refractive index material portions is air.

4. The laser of claim 1, wherein the second width is 10 nm to 50 nm greater than the first width.

5. The laser of claim 4, wherein the plurality of first portions are alternately arranged with the plurality of second portions.

6. The laser of claim 4, wherein each one of the plurality of second portions is alternately arranged with at least two of the plurality of first portions.

7. The laser of claim 4, wherein
N is greater than or equal to 3,
less than N of the plurality of second portions are alternately arranged with every N of the plurality of first portions.

8. The laser of claim 4, wherein the first width is about 100 nm to about 200 nm.

9. The laser of claim 1, wherein the material layer of the grating mirror and the optical waveguide are defined by a top silicon layer of a silicon-on-oxide (SOI) substrate.

10. The laser of claim 1, wherein
the material layer is a silicon layer, and
the silicon layer includes portions having a constant width between the plurality of low refractive index material portions.

11. The laser of claim 1, further comprising:
a third low refractive index layer having a lower refractive index than silicon between the grating mirror and the second low refractive index layer, wherein
a pattern of the third low refractive index layer corresponds to a pattern of the material layer of the grating mirror, and
the plurality of low refractive index material portions are surrounded by the material layer, the first low refractive index layer, the second low refractive index layer, and the third low refractive index layer.

12. A hybrid vertical cavity laser for a photonic integrated circuit (PIC), the laser comprising:
a first low refractive index layer;
a second low refractive index layer on the first low refractive index layer;
a grating mirror between the first and second low refractive index layers,
the grating mirror including a plurality of bars that are spaced apart from each other and arranged in a two-dimensional array,
the first and second low refractive index layers each having refractive indices that are lower than a refractive index of the plurality of bars;
an optical waveguide optically coupled to one side of the grating mirror in a first direction;
a third low refractive index layer having lower refractive index than silicon between the plurality of bars of the grating mirror and the second low refractive index layer, wherein a pattern of the third low refractive index layer corresponds to a pattern of the plurality of bars;
a Group III-V semiconductor layer on the second low refractive index layer,
the Group III-V semiconductor layer including an active layer; and
a top mirror on the Group III-V semiconductor layer.

13. The laser of claim 12, wherein
each of the plurality of bars are elongated in a second direction that crosses the first direction, and
the plurality of bars are a plurality of silicon bars.

14. The laser of claim 13, wherein the plurality of bars and the optical waveguide are defined by a top silicon layer of a silicon-on-oxide (SOI) substrate.

15. A hybrid vertical cavity laser for a photonic integrated circuit (PIC), the laser comprising:
a first low refractive index layer;
a second low refractive index layer on the first low refractive index layer;
a grating mirror between the first and second low refractive index layers,
the grating mirror including a material layer,
the first and second low refractive index layers having refractive indices that are lower than a refractive index of the material layer,
the grating mirror including a plurality of low refractive index portions that are separated by parts of the material layer,
the plurality of low refractive index material portions being arranged parallel to each other and each having a bar shape,
each one of the plurality of low refractive index material portions, in combination with an adjacent one of the parts of the material layer, having a same pitch in a first direction,
the plurality of low refractive index material portions extending in a second direction that is perpendicular to the first direction,
the plurality of low refractive index material portions having a refractive index that is lower than the refractive index of the material layer, and
the plurality of low refractive index material portions including a plurality of first portions having a first width in the first direction and a plurality of second portions having a second width that is different than the first width and extends in the first direction;
an optical waveguide optically coupled to one side of the grating mirror in a first direction;
a Group III-V semiconductor layer on the second low refractive index layer,
the Group III-V semiconductor layer including an active layer; and
a top mirror on the Group III-V semiconductor layer.

16. The laser of claim 15, wherein the material layer is a silicon layer.

17. The laser of claim 15, wherein a material of each of the plurality of low refractive index material portions is air.

18. The laser of claim 15, wherein the second width is 10 nm to 50 nm greater than the first width.

19. The laser of claim 18, wherein the plurality of first portions are alternately arranged with the plurality of second portions.

20. The laser of claim 18, wherein each one of the plurality of second portions is alternately arranged with at least two of the plurality of first portions.

21. The laser of claim 18, wherein
N is greater than or equal to 3,
less than N of plurality of second portions are alternately arranged with every N of the plurality of first portions.

22. The laser of claim 18, wherein the first width is about 100 nm to about 200 nm.

23. The laser of claim 15, wherein the material layer and the optical waveguide are defined by a top silicon layer of a silicon-on-oxide (SOI) substrate.

24. The laser of claim 15, further comprising:
a third low refractive index layer having lower refractive index than silicon which is between the grating mirror and the second low refractive index layer, wherein
a shape of the third low refractive index layer corresponds to a shape of the material layer of the grating mirror, and the plurality of low refractive index material portions have a bar shape, and
the plurality of low refractive index material portions are surrounded by the material layer, the third low refractive index layer, and the first and second low refractive index layers.

* * * * *